(12) United States Patent
Bhalla et al.

(10) Patent No.: US 8,637,368 B2
(45) Date of Patent: Jan. 28, 2014

(54) FABRICATION OF MOS DEVICE WITH VARYING TRENCH DEPTH

(75) Inventors: Anup Bhalla, Santa Clara, CA (US); Xiaobin Wang, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 3 days.

(21) Appl. No.: 13/559,975

(22) Filed: Jul. 27, 2012

(65) Prior Publication Data

US 2012/0302021 A1 Nov. 29, 2012

Related U.S. Application Data

(63) Continuation of application No. 13/088,275, filed on Apr. 15, 2011, now Pat. No. 8,253,192, which is a continuation of application No. 12/228,142, filed on Aug. 7, 2008, now Pat. No. 7,948,029, which is a continuation-in-part of application No. 12/005,166, filed on Dec. 21, 2007, now Pat. No. 8,362,547, which is a continuation-in-part of application No. 11/900,616, filed on Sep. 11, 2007, now Pat. No. 7,605,425, which is a continuation of application No. 11/056,346, filed on Feb. 11, 2005, now Pat. No. 7,285,822.

(51) Int. Cl.
    *H01L 21/336* (2006.01)
(52) U.S. Cl.
    USPC ............ 438/259; 438/270; 438/271; 438/589
(58) Field of Classification Search
    USPC .................................................. 438/259, 589
    See application file for complete search history.

(56) References Cited

U.S. PATENT DOCUMENTS

| | | |
|---|---|---|
| 4,156,246 A | 5/1979 | Pendersen |
| 4,521,795 A | 6/1985 | Coe et al. |
| 4,823,172 A | 4/1989 | Mihara |
| 4,967,243 A | 10/1990 | Baliga et al. |
| 4,967,245 A | 10/1990 | Cogan et al. |
| 5,111,253 A | 5/1992 | Korman et al. |
| 5,164,325 A | 11/1992 | Cogan et al. |
| 5,366,914 A | 11/1994 | Takahashi et al. |
| 5,576,245 A | 11/1996 | Cogan et al. |
| 5,623,152 A | 4/1997 | Majumdar et al. |
| 5,886,383 A | 3/1999 | Kinzer |
| 6,037,628 A | 3/2000 | Huang |
| 6,110,799 A | 8/2000 | Huang |
| 6,351,018 B1 | 2/2002 | Sapp |
| 6,359,306 B1 | 3/2002 | Ninomiya |
| 6,608,350 B2 | 8/2003 | Kinzer |

(Continued)

FOREIGN PATENT DOCUMENTS

JP 09/102602 4/1997

*Primary Examiner* — Thien F Tran
(74) *Attorney, Agent, or Firm* — Van Pelt, Yi & James LLP

(57) ABSTRACT

Fabricating a semiconductor device includes: forming a gate trench in an epitaxial layer overlaying a semiconductor substrate; disposing gate material in the gate trench; forming a body in the epitaxial layer; forming a source in the body; forming an active region contact trench that has a varying trench depth; and disposing a contact electrode within the active region contact trench. Forming the active region contact trench includes performing a first etch to form a first contact trench depth associated with a first region, and performing a second etch to form a second contact trench depth associated with a second region. The first contact trench depth is substantially different from the second contact trench depth.

12 Claims, 19 Drawing Sheets

(56) References Cited

U.S. PATENT DOCUMENTS

| | | |
|---|---|---|
| 6,638,826 B2 | 10/2003 | Zeng et al. |
| 6,686,814 B2 | 2/2004 | Chiu et al. |
| 6,737,704 B1 | 5/2004 | Takemori et al. |
| 6,774,408 B2 | 8/2004 | Ninomiya |
| 6,818,946 B1 | 11/2004 | Venkatraman |
| 6,841,836 B2 | 1/2005 | Saggio et al. |
| 6,872,611 B2 | 3/2005 | Takemori et al. |
| 6,987,305 B2 | 1/2006 | He et al. |
| 7,564,097 B2 | 7/2009 | Ono et al. |
| 7,667,264 B2 | 2/2010 | Tai et al. |
| 2006/0273385 A1 | 12/2006 | Hshieh |
| 2007/0278565 A1 | 12/2007 | Tu et al. |

(ABC)

(ABC)

(DEF)

(DEF)

(ABC)

(ABC)

US 8,637,368 B2

FABRICATION OF MOS DEVICE WITH VARYING TRENCH DEPTH

CROSS REFERENCE TO OTHER APPLICATIONS

This application is a continuation of U.S. patent application Ser. No. 13/088,275 entitled MOS DEVICE WITH VARYING TRENCH DEPTH filed Apr. 15, 2011, which is incorporated herein by reference for all purposes and which is a continuation of U.S. Pat. No. 7,948,029 entitled MOS DEVICE WITH VARYING TRENCH DEPTH filed Aug. 7, 2008, which is incorporated herein by reference for all purposes and which is a continuation in part of U.S. patent application Ser. No. 12/005,166 entitled MOS DEVICE WITH SCHOTTKY BARRIER CONTROLLING LAYER filed Dec. 21, 2007, which is incorporated herein by reference for all purposes and which is a continuation in part of U.S. Pat. No. 7,605,425 entitled POWER MOS DEVICE filed Sep. 11, 2007, which is incorporated herein by reference for all purposes and which is a continuation of U.S. Pat. No. 7,285,822 entitled POWER MOS DEVICE filed Feb. 11, 2005, which is incorporated herein by reference for all purposes.

BACKGROUND OF THE INVENTION

Modern semiconductor devices often have high cell density and small cell size. As density increases and cell size decreases, there is often insufficient room for making adequate ohmic contacts to the body, causing the unclamped inductive switching (UIS) capability of such a device to degrade. Existing techniques for improving UIS capability often lead to slower diode recovery. It would be useful if UIS capability and diode reverse recovery can be improved for high density devices.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1A:
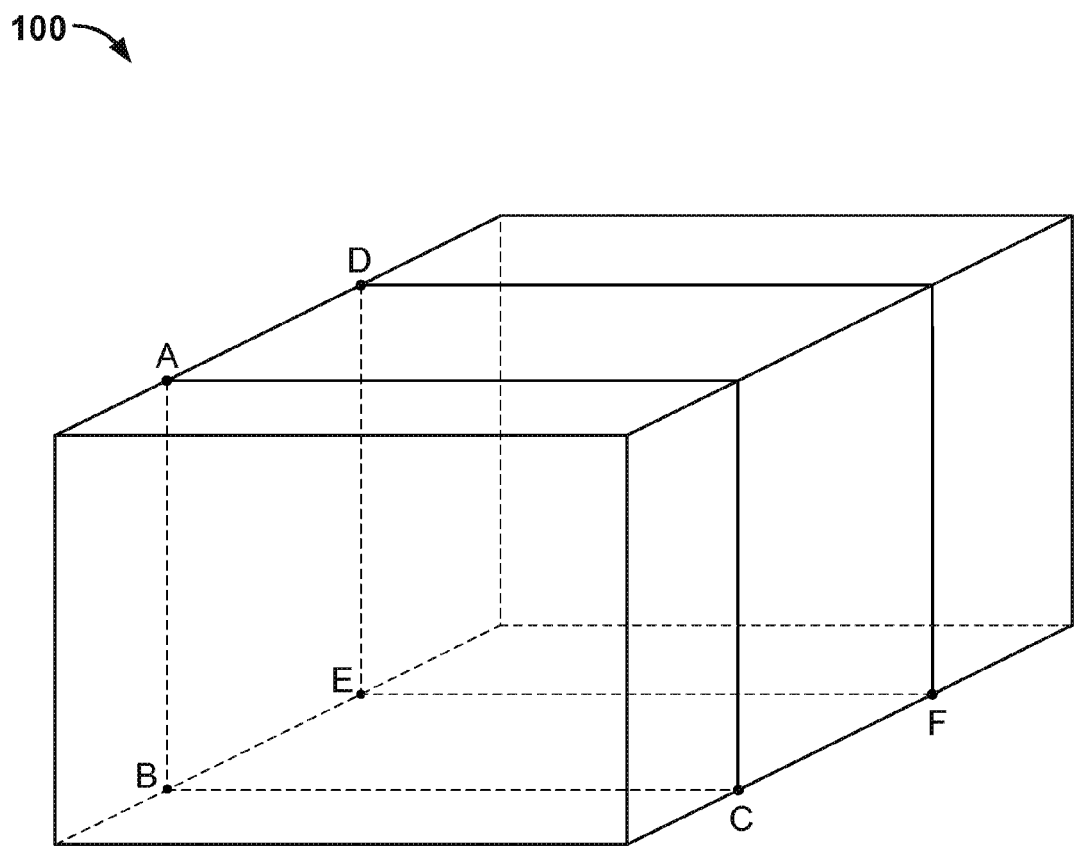
FIG. 1A is a three-dimensional (3D) diagram illustrating an embodiment of a double-diffused metal oxide semiconductor (DMOS) device.

FIG. 1A is a three-dimensional (3D) diagram illustrating an embodiment of a double-diffused metal oxide semiconductor (DMOS) device. In this example, device 100 is a striped cell. Details of the device are not shown in this figure but will be discussed extensively below. Two cross sectional planes ABC and DEF are shown and will be referred to in the discussions below.

Figure 1B:
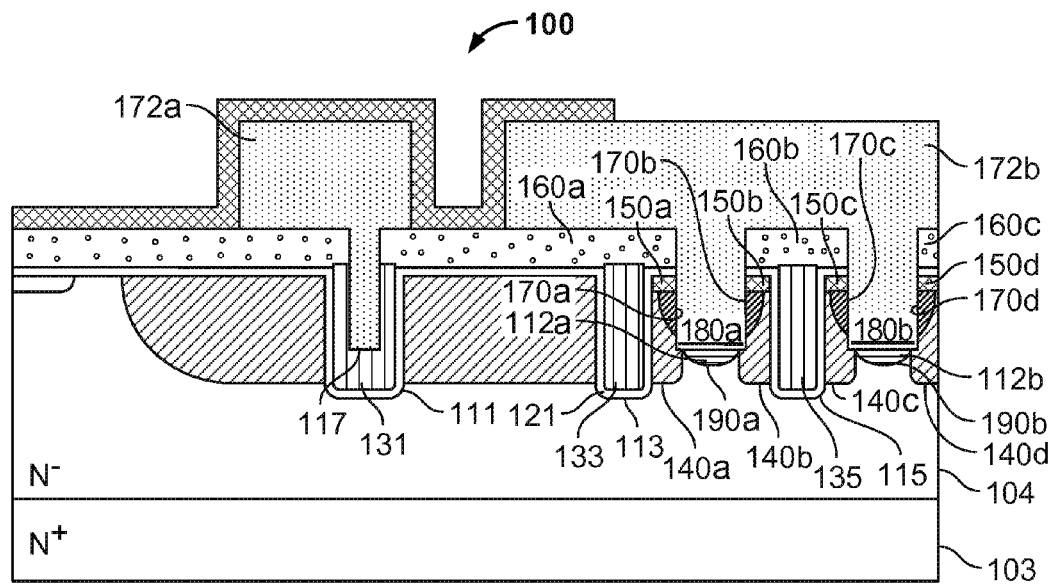
FIG. 1B is a cross sectional view illustrating the ABC cross section of device 100.

FIG. 1B is a cross sectional view illustrating the ABC cross section of device 100. In this example, device 100 includes a drain that is formed on the back of an $N^+$-type semiconductor substrate 103. The drain region extends into an epitaxial (epi) layer 104 of $N^-$-type semiconductor that overlays substrate 103. Gate trenches such as 111, 113, and 115 are etched in epi layer 104. A gate oxide layer 121 is formed inside the gate trenches. Gates 131, 133 and 135 are disposed inside gate trenches 111, 113 and 115, respectively, and are insulated from the epi layer by the oxide layer. The gates are made of a conductive material such as polycrystalline silicon (poly), and the oxide layer is made of an insulating material such as thermal oxide. Specifically gate trench 111 is located in a termination region disposed with a gate runner 131 for connection to gate contact metal. In some embodiments, gate runner trench 111 is wider and deeper compared to active gate trenches 113 and 115. In some embodiments the spacing between the gate runner trench 111 from the active trench next to it, in this case trench 113, is larger than the spacing between the active gate trenches 113 and 115.

Source regions 150a-d are embedded in body regions 140a-d, respectively. The source regions extend downward from the top surface of the body into the body itself. While body regions are implanted along side of all gate trenches, source regions are only implanted next to active gate trenches and not gate runner trenches. In the embodiment shown, gates such as 133 have a gate top surface that extends substantially above the top surface of the body where the source is embedded. Such a configuration guarantees the overlap of the gate and the source, allowing the source region to be shallower than the source region of a device with a recessed gate, and increases device efficiency and performance. The amount by which the gate poly top surface extends above the source-body junction may vary for different embodiments. In some embodiments, the gates of the device do not extend above the top surface of the source/body region but rather recess from the top surface of the source/body region.

During operation, the drain region and the body regions together act as a diode, referred to as the body diode. A dielectric material layer 160 is disposed over the gate to insulate the gate from source-body contact. The dielectric material forms insulating regions such as 160a-c on top of the gates as well as on top of the body and source regions. Appropriate dielectric materials include thermal oxide, low temperature oxide (LTO), boro-phospho-silicate glass (BPSG), etc.

A number of contact trenches 112a-b are formed between the active gate trenches near the source and body regions. These trenches are referred to as active region contact trenches since the trenches are adjacent to the device's active region that is formed by the source and body regions. For example, contact trench 112a extends through the source and the body, forming source regions 150a-b and body regions 140a-b adjacent to the trench. In contrast, trench 117, which is formed on top of gate runner 131, is not located next to an active region and therefore is not an active region contact trench. Trench 117 is referred to as a gate contact trench or gate runner trench since a metal layer 172a connected to the gate signal is deposited within the trench. The gate signal is fed to active gates 133 and 135 through interconnections between trenches 111, 113 and 115 in the third dimension (not shown). Metal layer 172a is separated from metal layer 172b, which connects to source and body regions through contact trenches 112a-b to supply a power source. In the example shown, the active region contact trenches and gate contact trench have approximately the same depth.

Device 100 has active region contact trenches 112a-b that are shallower than the body. This configuration provides good breakdown characteristics as well as lower resistance and leakage current. Additionally, since the active contact trenches and gate contact trench are formed using a one step process and therefore have the same depth, having active contact trenches that are shallower than the body prevents the gate runner such as 131 from being penetrated by the gate contact trench.

In the example shown, the FET channel is formed along the active region gate trench sidewall between the source/body and body/drain junctions. In a device with a short channel region, as the voltage between the source and the drain increases, the depletion region expands and may eventually reach the source junction. This phenomenon, referred to as punch through, limits the extent to which the channel may be shortened. In some embodiments, to prevent punch through, regions such as 170a-d along the walls of the active region contact trench are heavily doped with P-type material to form $P^+$-type regions. The $P^+$-type regions prevent the depletion region from encroaching upon the source region. Thus, these implants are sometimes referred to as anti-punch through implants or punch through prevention implants. In some embodiments, to achieve pronounced anti-punch through effects, the $P^+$ regions are disposed as close as possible to the channel region and/or as close as allowed by manufacturing alignment capability and $P^+$ sidewall dopant penetration control. In some embodiments, the misalignment between the trench contact and the trench is minimized by self-aligning the contact, and the trench contact is placed as closely centered between the trenches as possible. These structural enhancements allow the channel to be shortened such that the net charge in the channel per unit area is well below the minimum charge needed to prevent punch through in an ideal unprotected structure. In addition to improving body contact resistance, the anti-punch through implants also makes it possible to construct very shallow trench short-channel devices. In the embodiment shown, contact trenches 112a-b are shallower than body regions 140a-d and do not extend all the way through the body regions.

A conductive material is disposed in contact trenches 112a-b as well as gate trench 117 to form contact electrodes. In the active region, since the punch-through implants are disposed along the sidewalls of the contact trenches but not along the bottoms of the contact trenches, the contact electrodes are in contact with $N^-$ drain region 104. The contact electrodes and the drain region form Schottky diodes that are in parallel with the body diode. The areas where the contact electrodes and the drain regions are in contact are referred to as Schottky contacts. A single metal that is capable of simultaneously forming a Schottky contact to the $N^-$ drain and forming a good ohmic contact to the $P^+$ body and $N^+$ source is used to form electrodes 180a-b. Metals such as titanium (Ti), platinum (Pt), palladium (Pd), tungsten (W) or any other appropriate material may be used. In some embodiments, metal layer 172 is made of aluminum (Al) or made of a Ti/TiN/Al stack.

The Schottky diodes reduce the body diode forward drop and minimize the stored charge, thereby improving the diode recovery characteristics and making the MOSFET more efficient. A device with Schottky contacts is also less likely to exhibit unwanted oscillation behavior. The unclamped inductive switching (UIS) capability of the device, however, is reduced, causing the device to be less robust.

The leakage current of the Schottky diode is related to the Schottky barrier height. As the barrier height increases, the leakage current decreases, and the forward drop voltage also increases. In the example shown, optional Schottky barrier controlling layers 190a-b (also known as Shannon layers) are formed below the contact electrode, by implanting thin layers of dopants around the bottoms of active region trenches 112a-b. The dopants have opposite polarity as the epi layer and are of P-type in this example. The Shannon implant is shallow and low dosage; therefore, it is completely depleted regardless of bias. The Schottky barrier controlling layer is used to control the Schottky barrier height, thus allowing for better control over the leakage current and improving the reverse recovery characteristics of the Schottky diode. Details of the formation of the Schottky barrier controlling layer are described below. In this embodiment, Schottky barrier control layers 180a and 180b are optionally formed in active region contact trenches 112a and 112b.

Figure 1C:
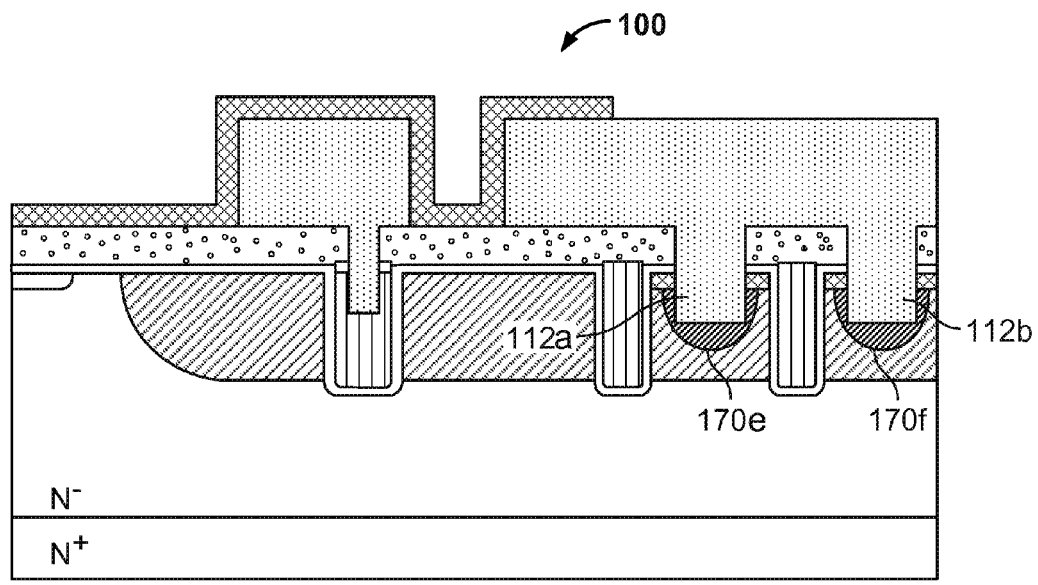
FIG. 1C is a cross sectional view illustrating the DEF cross section of device 100.

FIG. 1C is a cross sectional view illustrating the DEF cross section of device 100. The trench depth of active region contact trenches 112a and 112b in the DEF cross sectional plane are shallower compared to the same contact trenches across the ABC plane. In this cross sectional region, the active electrodes disposed in the active region contact trenches are in contact with heavily doped $P^+$ regions 170e and 170f to form ohmic contacts (also referred to as body contacts), and no Schottky diode is formed. Compared with a device with only Schottky contacts in the active region, a device with ohmic contacts in the active region is more robust since the ohmic contacts provide better unclamped inductive switching (UIS) capability. Body diode recovery characteristics of the latter device, however, are poorer. Such a device is also more prone to exhibiting unwanted oscillation behavior.

Figure 2:
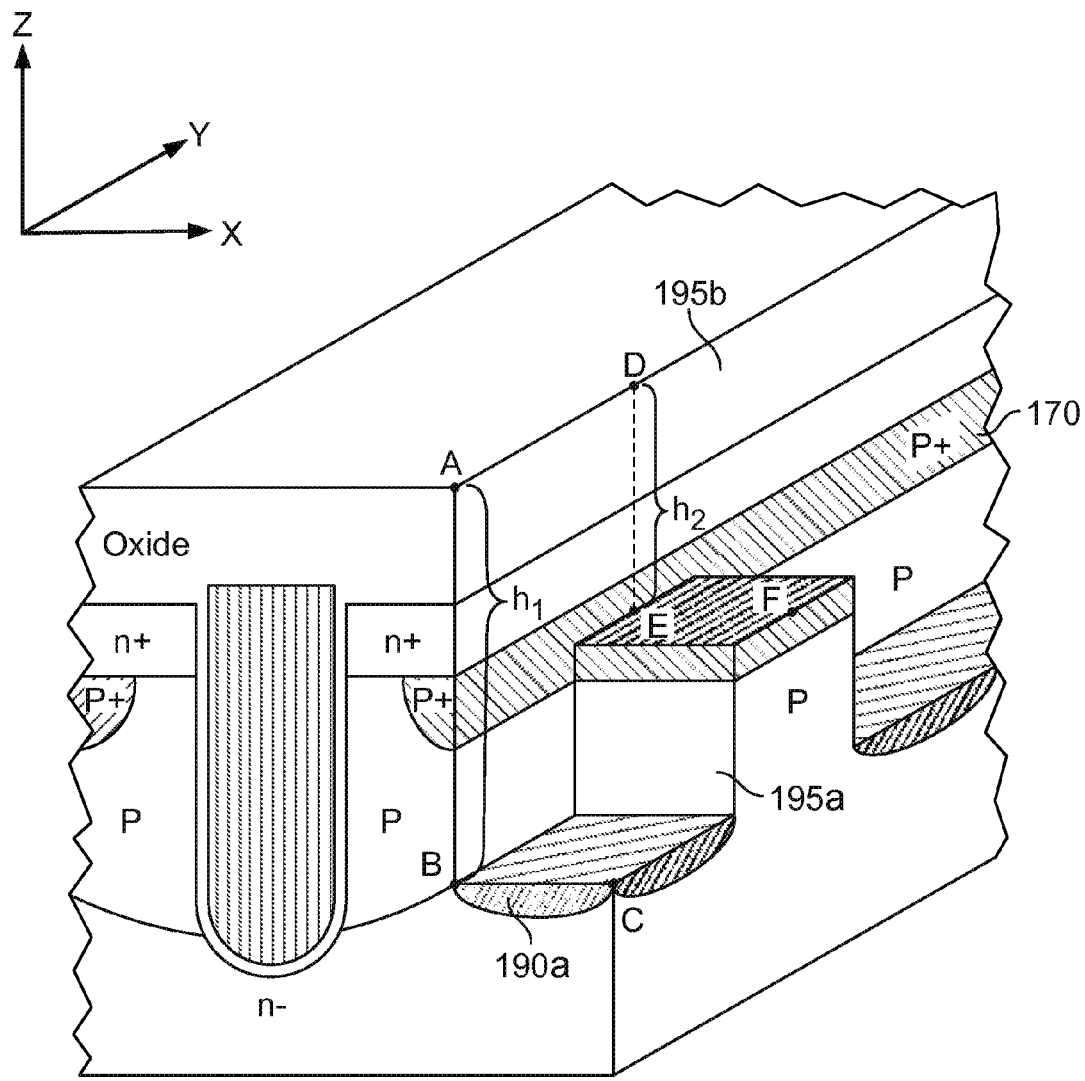
FIG. 2 is a 3D view of device 100.

FIG. 2 is a 3D view of device 100. Only a portion of the device is shown. For purposes of explanation, the metal layer is not depicted. Active region contact trench 112a is cut lengthwise along the stripe in the y-direction. In this example, contact trench 112a is shown to have a trench depth that varies along its length in y-direction. Active region contact trench 112a is fabricated to have a varying trench depth such that trench depth $h_1$ is substantially different from trench depth $h_2$. Trench depths $h_1$ and $h_2$ are in cross sectional planes ABC and DEF, respectively. The difference between these trench depths is greater than any incidental depth variation that may be attributed to non-ideal processing conditions. In region 195a where the trench depth is $h_1$, a Schottky area is formed between the contact electrode (not shown) and the N⁻ drain region. An optional Schottky barrier control layer 190a is implanted. In region 195b where the trench depth is $h_2$, a body contact area is formed between the contact electrode and the P⁺ region. The body contact area supports a bypass path for holes during UIS. Additional Schottky areas and/or body contact areas may be formed in some embodiments such that alternating Schottky areas and body contact areas are staggered along the length of the contact trench. The contact electrode forms source contact along the entire length of the stripe.

Figure 3:
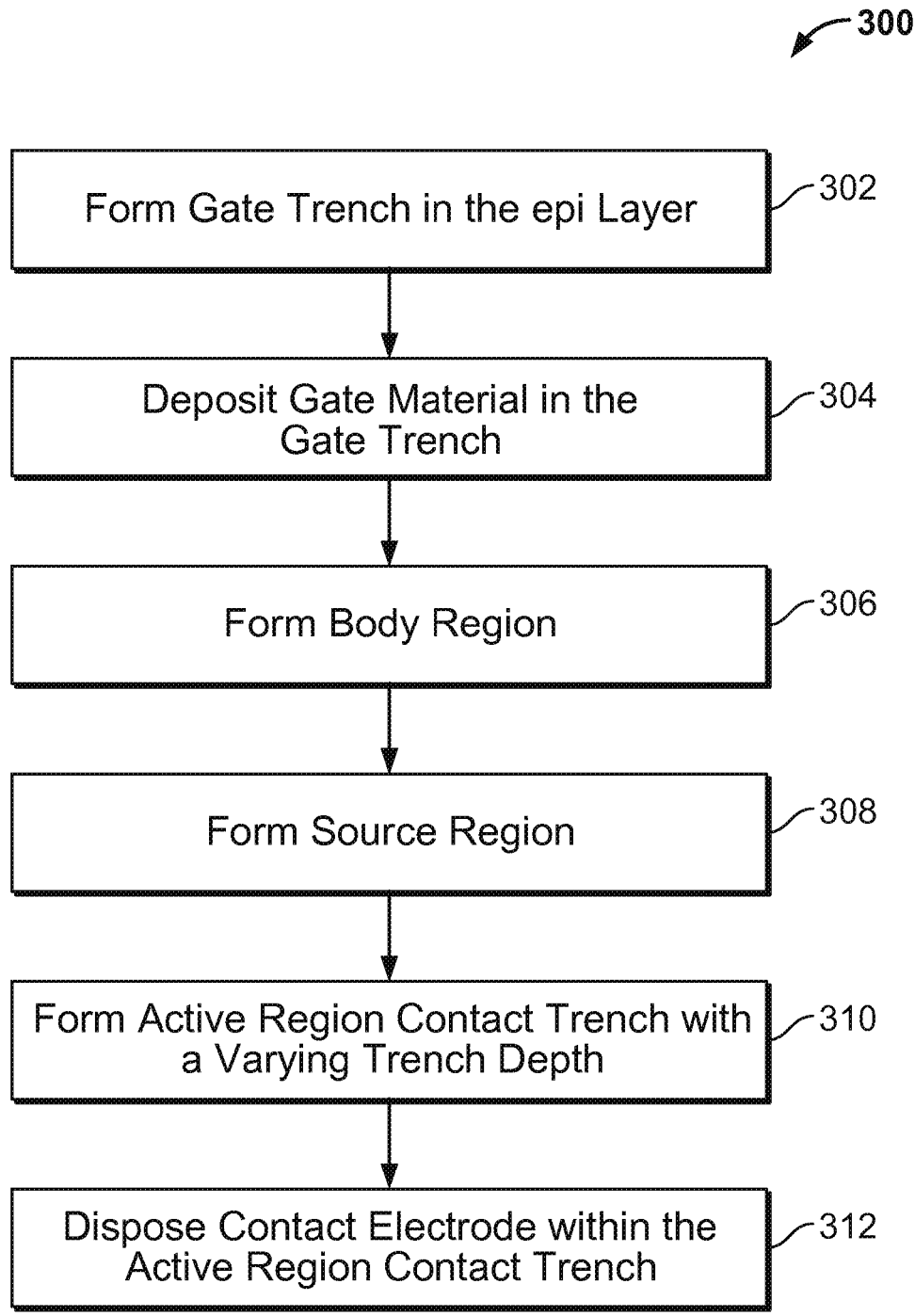
FIG. 3 is a flowchart illustrating an embodiment of a process for fabricating a device similar to 100.

FIG. 3 is a flowchart illustrating an embodiment of a process for fabricating a device similar to 100. In this example, process 300 begins with forming one or more gate trenches in the epi layer, at 302. At 304, gate material is deposited in the gate trench. At 306, one or more body regions are formed. At 308, one or more source regions are formed. At 310, one or more active region contact trenches are formed, wherein at least one of which has a varying trench depth. At 312, one or more contact electrodes are disposed within the one or more active region contact trenches.

Figure 4A:
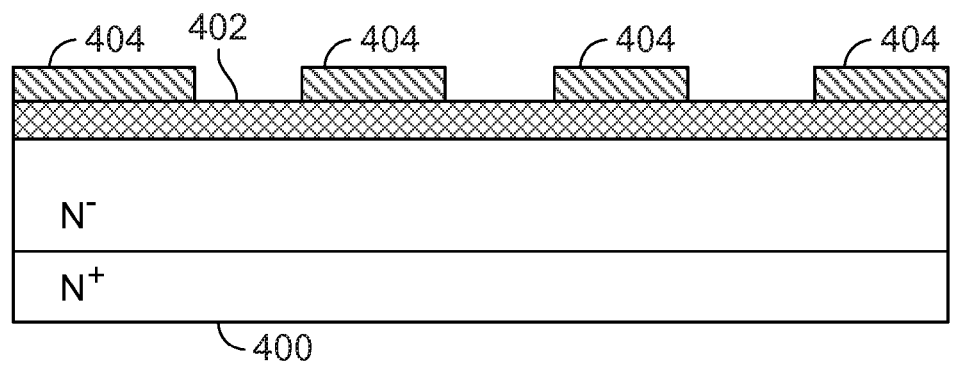
FIGS. 4A-4R, 4S(ABC)-4V(ABC) and 4S(DEF)-4T(DEF) are diagrams illustrating in detail an example fabrication process used for fabricating an embodiment of an MOS device with a varying active region contact trench depth.
Figure 4B:
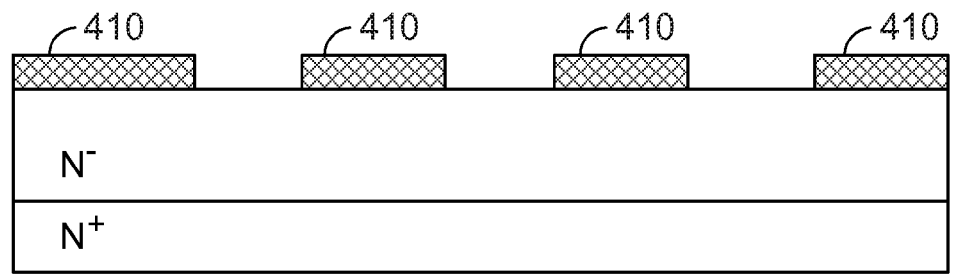
Figure 4C:
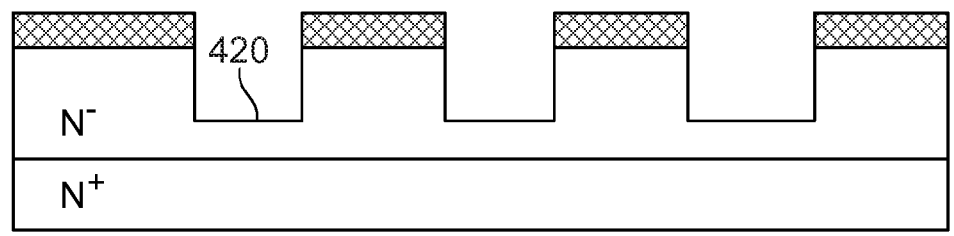
Figure 4D:
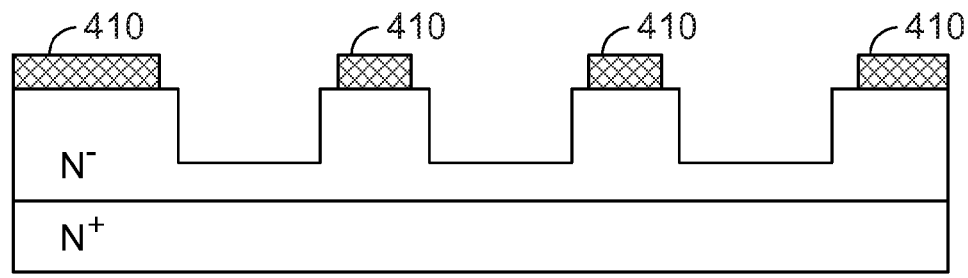
Figure 4E:
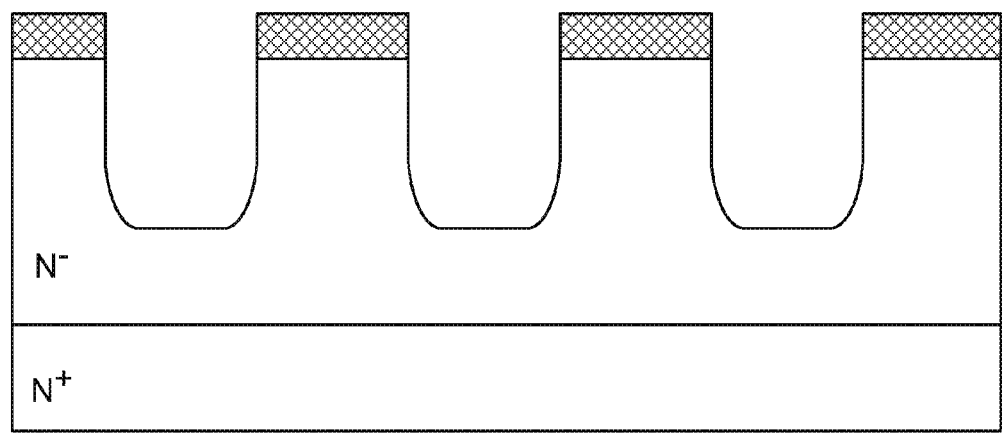
Figure 4F:
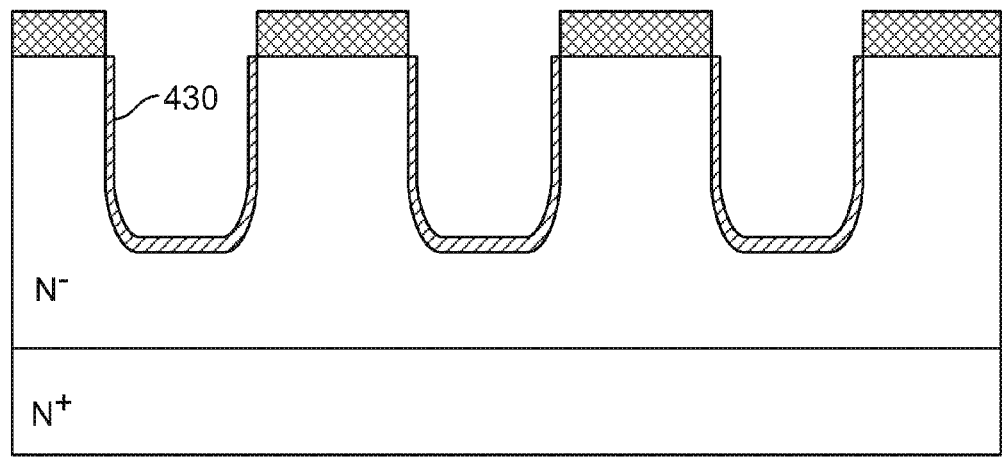
Figure 4G:
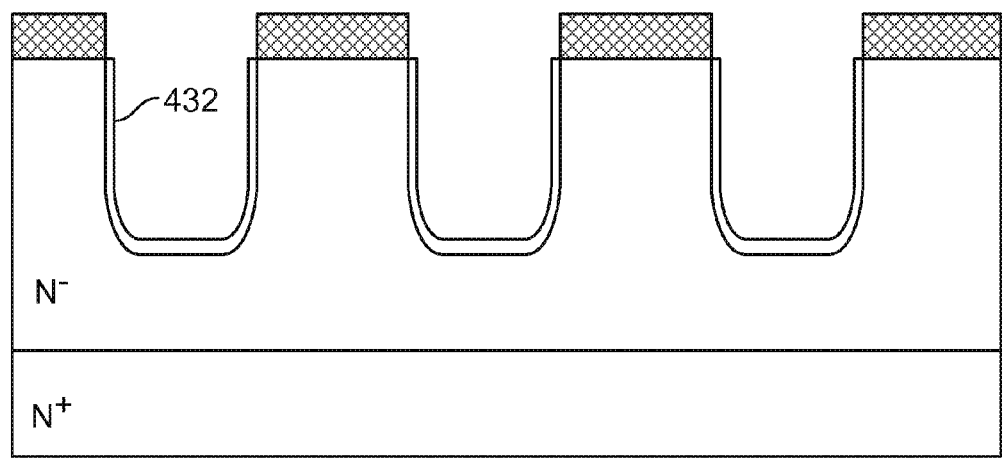
Figure 4H:
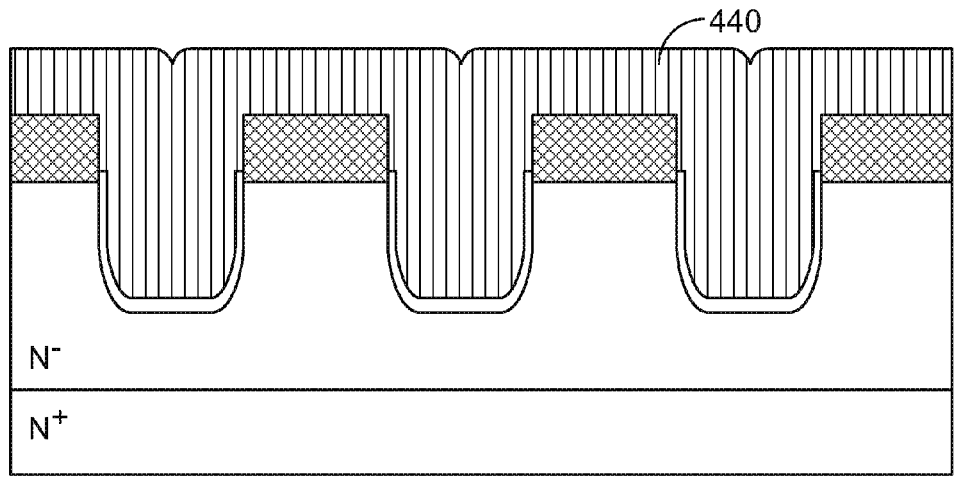
Figure 4I:
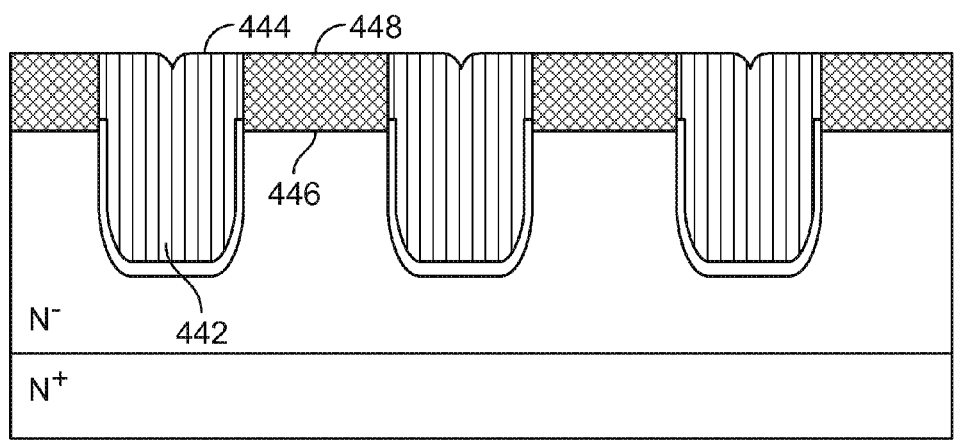
Figure 4J:
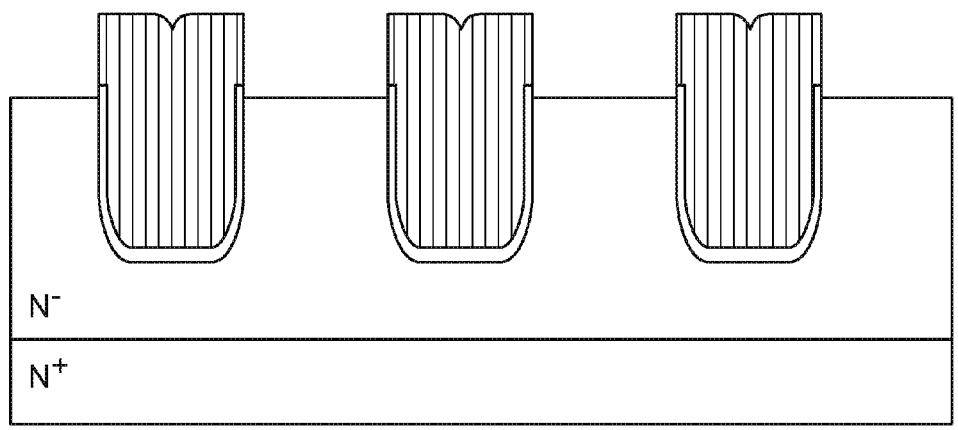
Figure 4K:
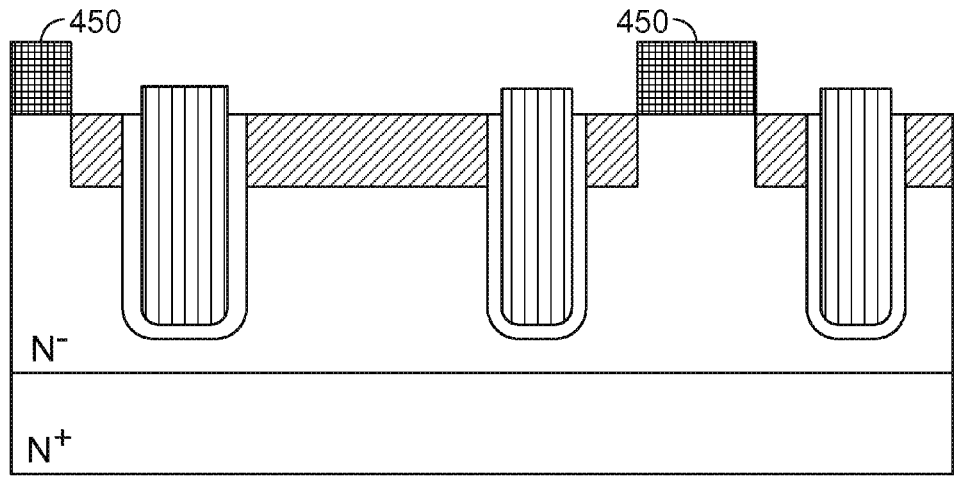
Figure 4L:
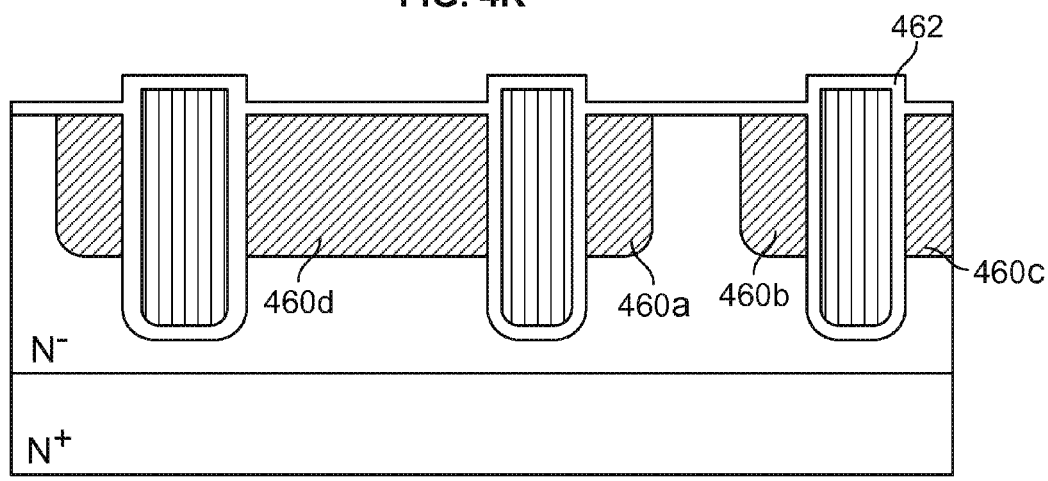
Figure 4M:
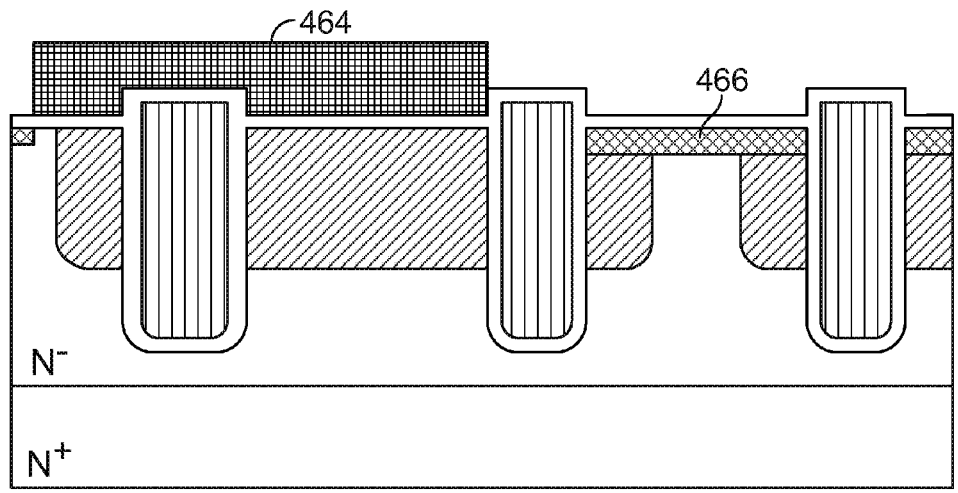
Figure 4N:
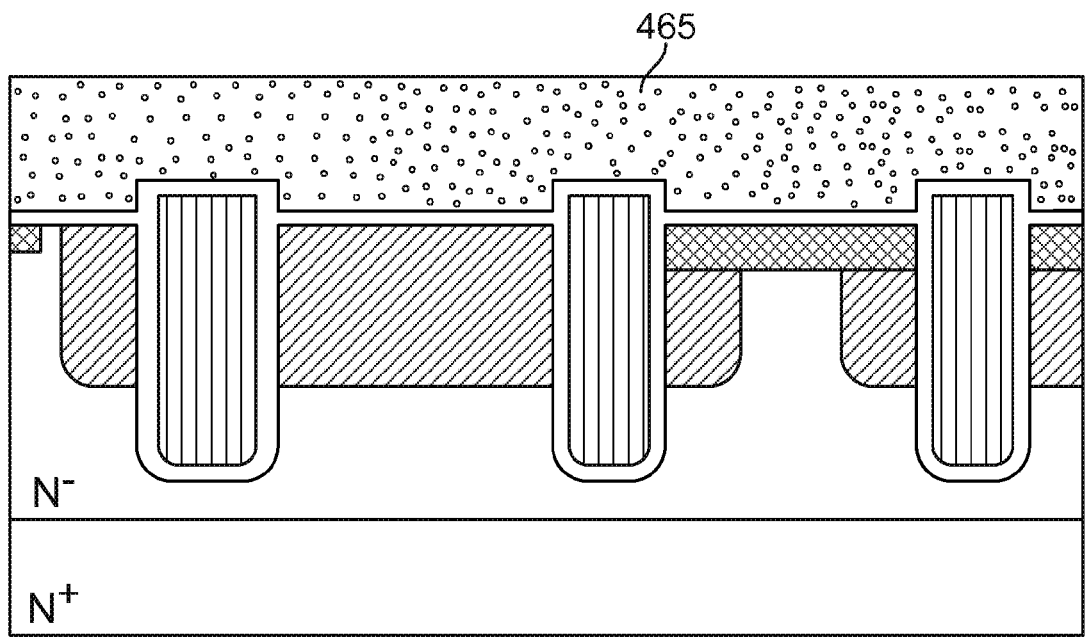
Figure 4O:
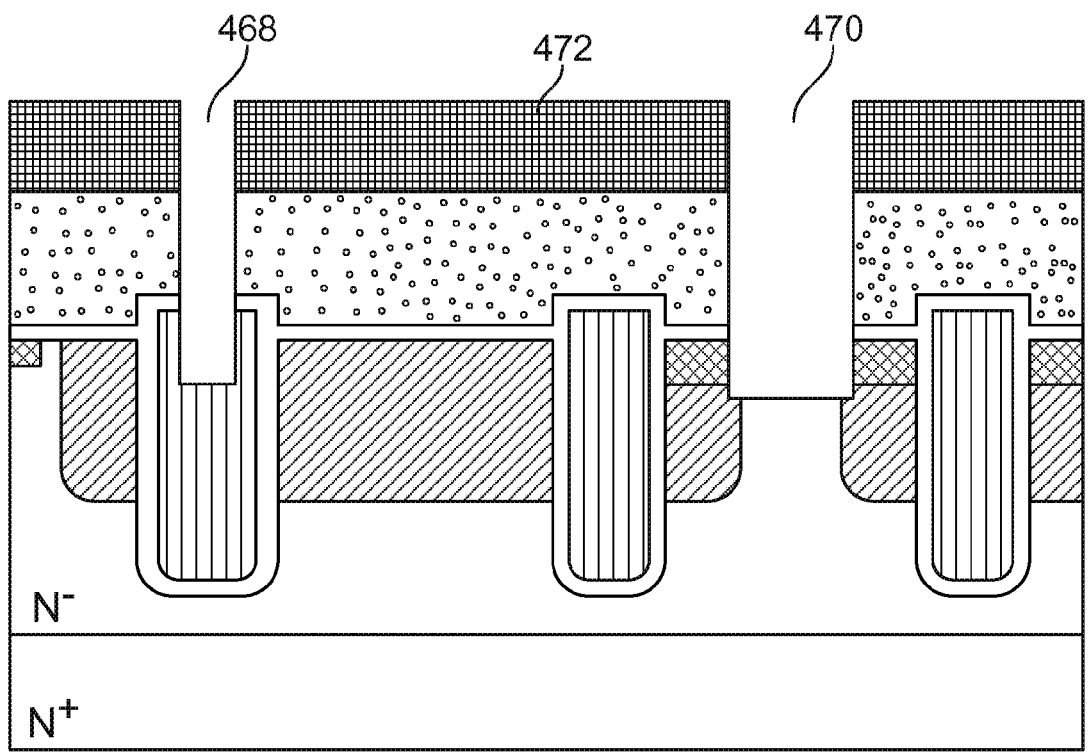
Figure 4P:
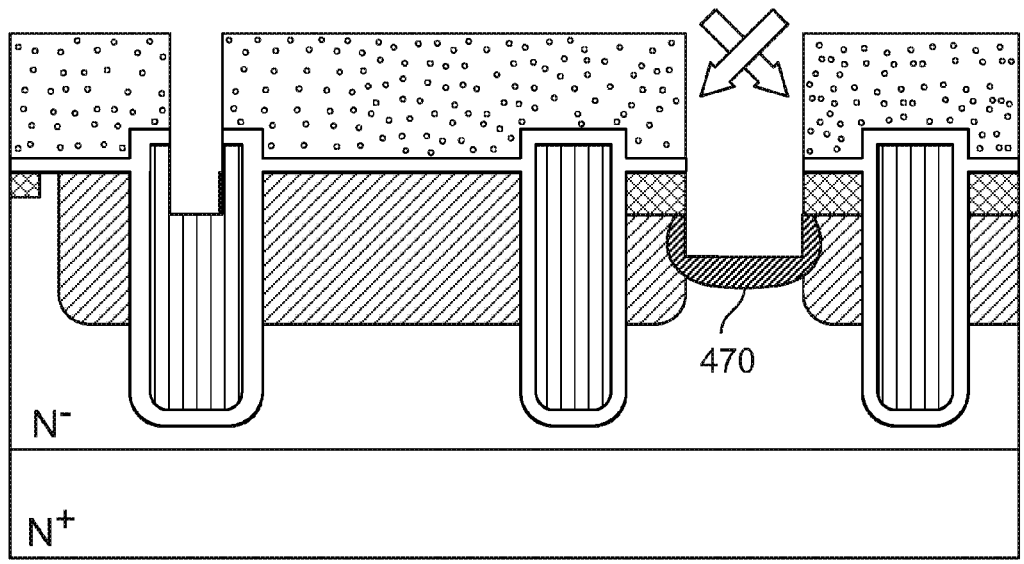
Figure 4Q:
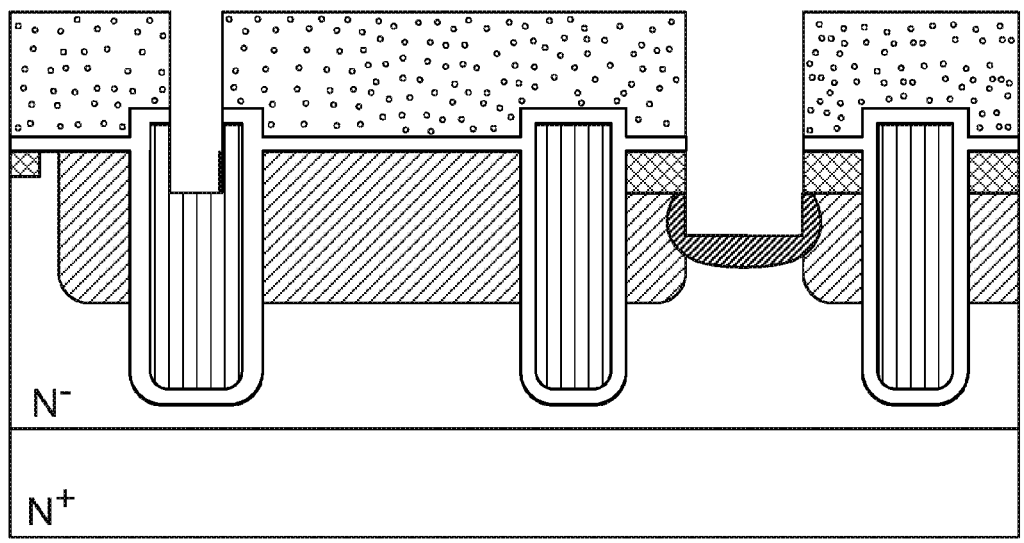
Figure 4R:
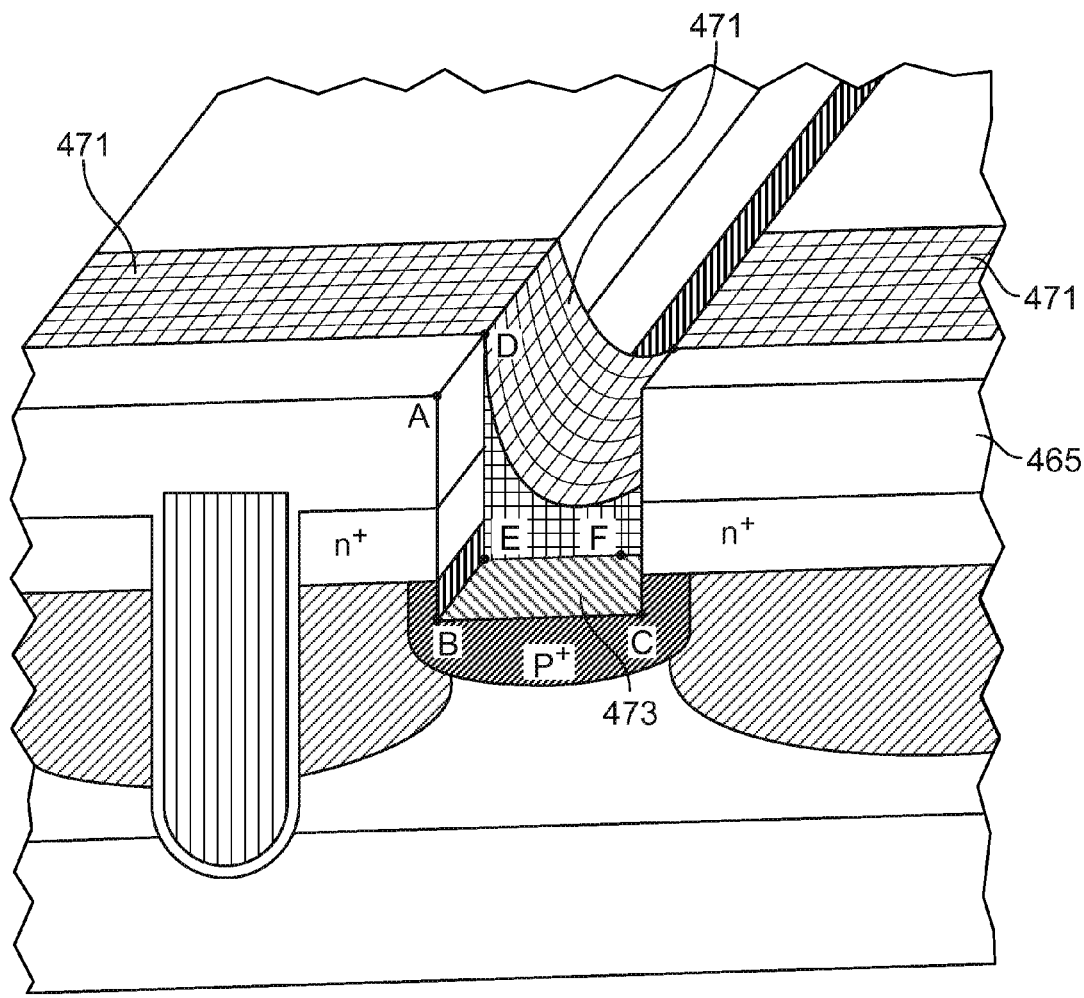
Figure 4S:
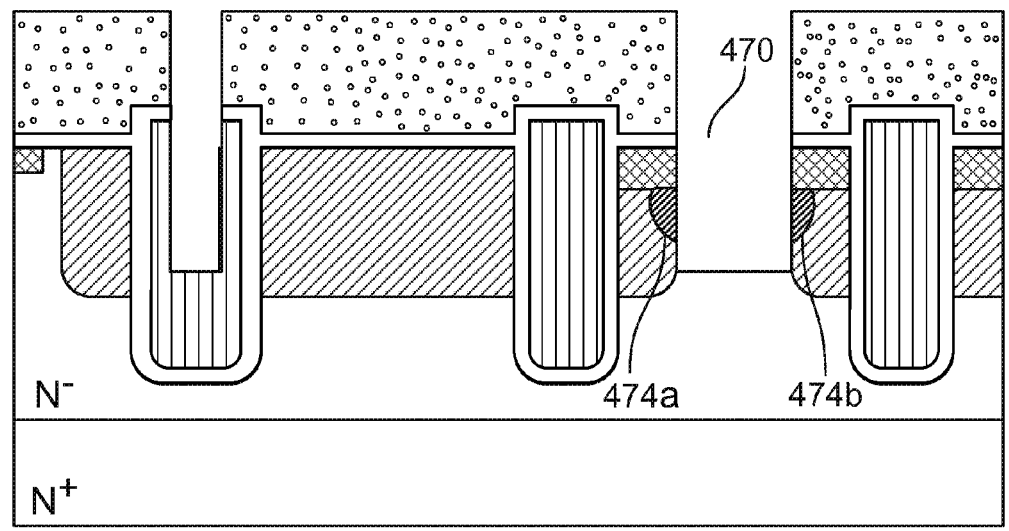

FIGS. 4A-4R, 4S(ABC)-4V(ABC) and 4S(DEF)-4T (DEF) are diagrams illustrating in detail an example fabrication process used for fabricating an embodiment of an MOS device with a varying active region contact trench depth. In this example, an N-type substrate (i.e., an N⁺ silicon wafer with an N⁻ epi layer grown on it) is used as the drain of the device.

FIGS. 4A-4J shows the formation of the gate. In FIG. 4A, a SiO₂ layer 402 is formed on N-type substrate 400 by deposition or thermal oxidation. The thickness of the silicon is oxide ranges from 100 Å to 30000 Å in various embodiments. Other thicknesses can be used. The thickness is adjusted depending on the desired height of the gate. A photoresist layer 404 is spun on top of the oxide layer and patterned using a trench mask.

In FIG. 4B, the SiO₂ in the exposed areas is removed, leaving a SiO₂ hard mask 410 for a silicon etching step. In FIG. 4C, the silicon is etched anisotropically, leaving trenches such as 420. The gate material is deposited in the trenches. Gates that are later formed within the trench have sides that are substantially perpendicular to the top surface of the substrate. In FIG. 4D, SiO₂ hard mask 410 is etched back by an appropriate amount so that the trench walls remain approximately aligned with the edge of the hard mask after later etching steps. SiO₂ is the mask material used in this embodiment because etching using a SiO₂ hard mask leaves relatively straight trench walls that mutually align with the sides of the mask. Other material may be used as appropriate. Certain other types of material traditionally used for hard mask etching, such as Si₃N₄, may leave the etched trench walls with a curvature that is less desirable for gate formation in the following steps.

In FIG. 4E, the substrate is etched isotropically to round out the bottoms of the trenches. The trench is approximately between 0.5-2.5 μm deep and approximately between 0.2-1.5 μm wide in some embodiments; other dimensions can also be used. In FIG. 4F, a sacrificial layer of SiO₂ 430 is grown in the trenches to provide a smooth surface for growing gate dielectric material. This layer is then removed by the process of wet etching. In FIG. 4G, a layer of SiO₂ 432 is grown thermally in the trenches as dielectric material.

In FIG. 4H, poly 440 is deposited to fill up the trenches. In this case, the poly is doped to obtain the appropriate gate resistance. In some embodiments, doping takes place as the poly layer is deposited (in situ). In some embodiments, the poly is doped after the deposition. In FIG. 4I, the poly layer on top of the SiO₂ is etched back to form gates such as 442. At this point, top surface 444 of the gate is still recessed relative to top surface 448 of the SiO₂; however, top surface 444 of the gate may be higher than top layer 446 of the silicon, depending on the thickness of hard mask layer 410. In some embodiments, no mask is used in poly etch back. In some embodiments, a mask is used in poly etch back to eliminate the use of an additional mask in the following body implanting process. In FIG. 4J, the SiO₂ hard mask is removed. In some embodiments, dry etch is used for hard mask removal. The etching process stops when the top silicon surface is encountered, leaving the poly gate extending beyond the substrate surface where source and body dopants will be implanted. In some embodiments, the gate extends beyond the substrate surface by approximately between 300 Å to 20000 Å. Other values can also be used. A SiO₂ hard mask is used in these embodiments since it provides the desired amount of gate extension beyond the Si surface in a controllable fashion. A screen oxide may then be grown across the wafer. The above processing steps may be simplified for fabricating devices with recessed gate poly. For example, in some embodiments a photoresist mask or a very thin SiO₂ hard mask is used during trench formation, and thus the resulting gate poly does not extend beyond the Si surface.

FIGS. 4K-4N illustrate the formation of the source and the body. In FIG. 4K, a photoresist layer 450 is patterned on the body surface using a body mask. The unmasked regions are implanted with body dopants. Dopants such as boron ions are implanted. In some embodiments that are not shown here, the body implant is carried out without body block 450, forming a continuous body region between active trenches. In FIG. 4L, the photoresist is removed and the wafer is heated to thermally diffuse the implanted body dopants via a process sometimes referred to as body drive. Body regions 460a-d are then formed. In some embodiments, the energy used for implanting the body dopants is approximately between 30-600 keV, the dose is approximately between 5e12-4e13 ions/cm², and the resulting final body depth is approximately between 0.3-2.4 μm. Different depths can be achieved by varying factors including the implant energy, dose, and diffusion temperature. An oxide layer 462 is formed during the diffusion process.

In FIG. 4M, a photoresist layer 464 is patterned using a source mask. In the embodiment shown, source mask 464 does not block any area between active trenches. In some embodiments, source mask 464 also blocks a center area between active trenches (not shown). The unmasked region 466 is implanted with source dopants. In this example, arsenic ions penetrate the silicon in the unmasked areas to form an N⁺ type source. In some embodiments, the energy used for implanting the source dopants is approximately between 10~100 keV, the dose is approximately between 1e15-1e16 ions/cm$^2$, and the resulting source depth is approximately between 0.05-0.5 μm. Further depth reduction can be achieved by varying factors such as the doping energy and dose. Other implant processes may also be used as appropriate. In FIG. 4N, the photoresist is removed, and the wafer is heated to thermally diffuse the implanted source dopants via a source drive process. A dielectric (e.g., BPSG) layer 465 is disposed on the top surface of the device after source drive and optionally densified in some embodiments.

FIGS. 4O-4T illustrate the formation of the contact trench and various implants along the contact trench. In FIG. 4O, a photoresist layer 472 is deposited on the dielectric layer and patterned using a contact mask. A first contact etch is performed to form trenches 468 and 470. In some embodiments, the depth of the first contact trench is between 0.2-2.5 μm.

In FIG. 4P, the photoresist layer is removed, and the area around the bottom of trench 470 is bombarded with implant ions to form a punch-through prevention layer. Boron ions with a dose of approximately 1-5e15 ions/cm$^2$ are used in some embodiments. The implant energy is approximately 10-60 keV. In some embodiments, BF$_2$ ions with a dose of approximately 1-5e15 ions/cm$^2$ and implant energy of 40-100 keV are used. In some embodiments, both BF$_2$ and Boron are implanted to form the punch-through prevention layer. The implantation tilt is approximately between 0-45°. In FIG. 4Q, the implant is thermally diffused.

The device is ready to be etched for the second time to generate a deeper trench for making Schottky contact. FIG. 4R is a 3D view of a portion of the device. A gate and an active region contact trench are shown. A layer of photoresist 471 is deposited and patterned using another contact mask. Another contact etch is performed. The photoresist keeps masked silicon areas underneath the photoresist from being etched. Silicon from unmasked regions (for example, area 473 in the contact trench) is removed, and dielectric layer 465 is unaffected. Cross sectional views of the device after the second etching, taken on cross sectional planes ABC and DEF are illustrated below.

Figure 4T:
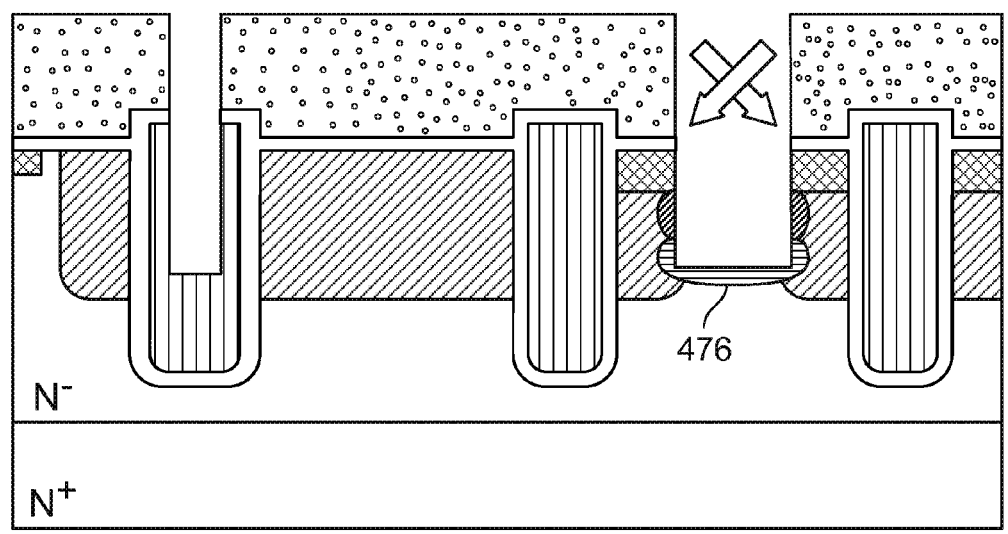
Figure 4S:
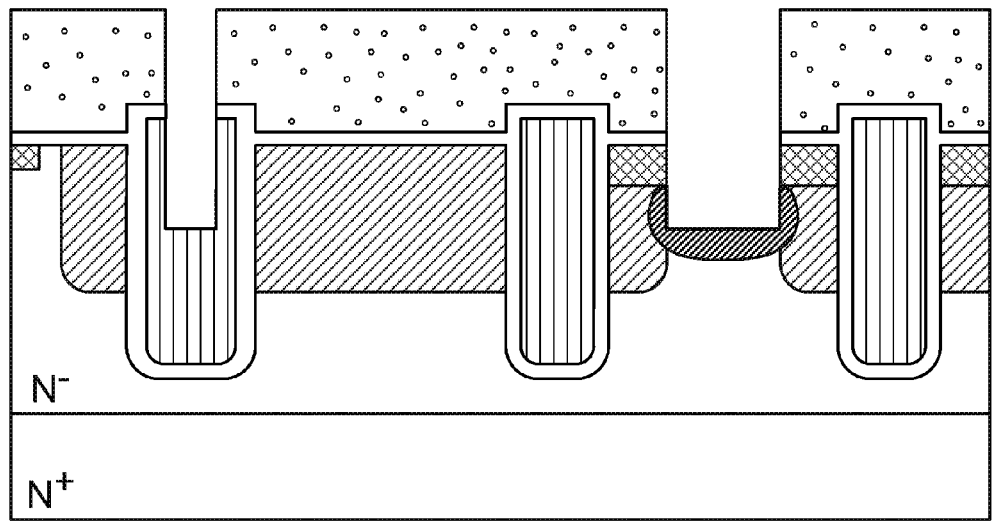
Figure 4T:
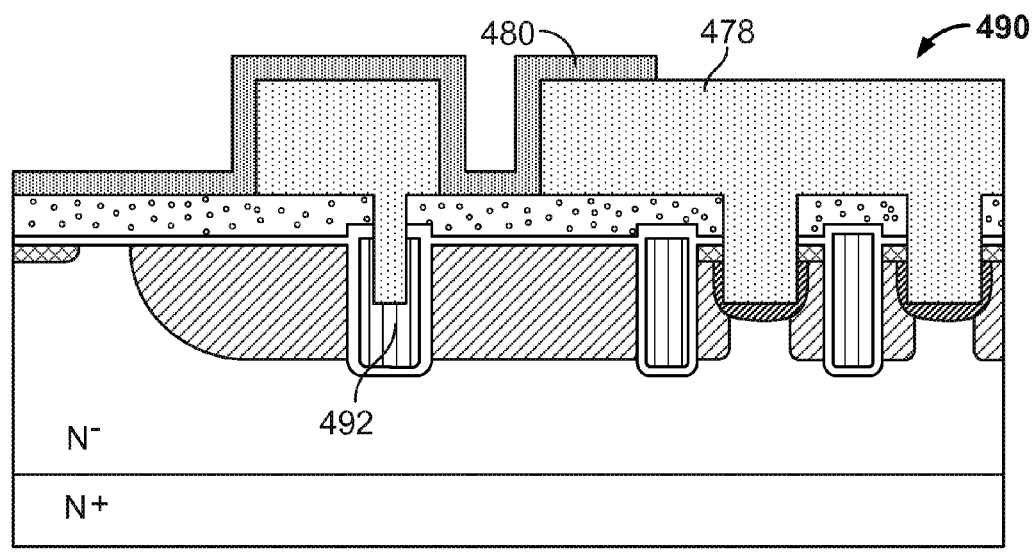
Figure 4U:
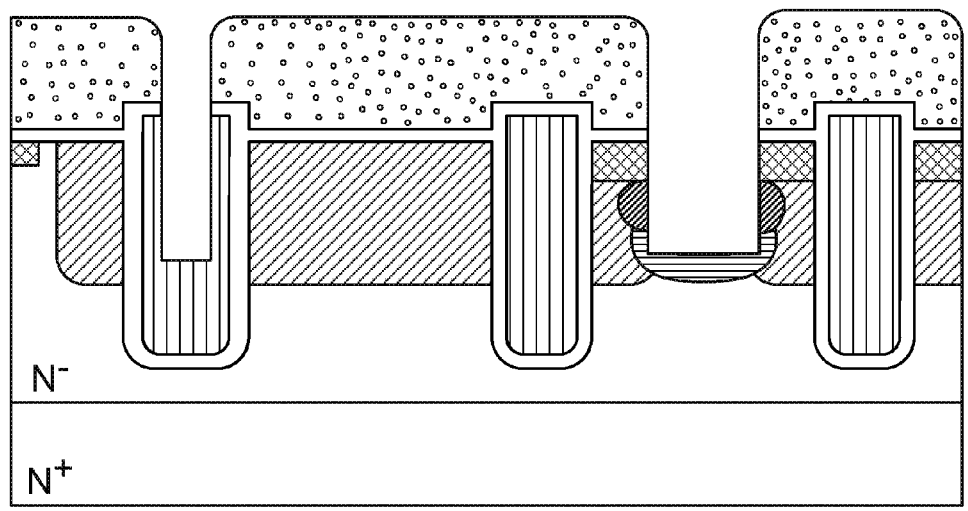
Figure 4V:
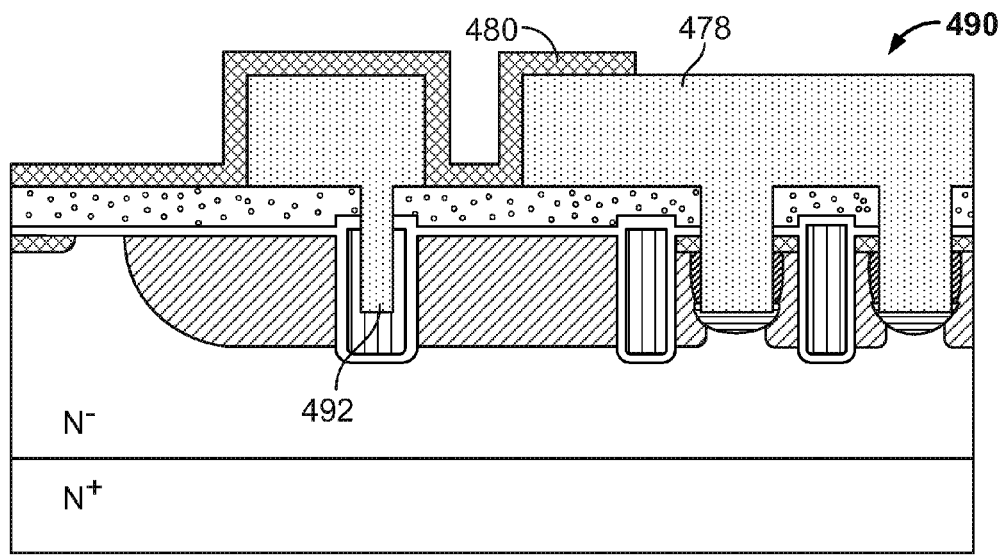

FIGS. 4S(ABC)-4V(ABC) are cross sectional views of the device across the ABC plane. FIG. 4S(ABC) shows the cross section after the second contact etch. Unmasked P$^+$ region is etched through, leaving behind P$^+$ material that forms antipunch through implants 474a-b along the trench walls. The depth of active region contact trench 470 is increased in this region. Approximately 0.15-0.5 μm of the P$^+$ material is removed in some embodiments. Optionally, as shown in FIG. 4T (ABC), a low dose shallow P-type Schottky barrier controlling layer 476 is formed using ion implantation. In some embodiments, boron or BF$_2$ with a dosage between 2e11-3e13 ions/cm$^2$ and implant energy between 10-100 keV are used. In FIG. 4U(ABC), the Schottky barrier controlling layer is activated by thermal diffusion. In comparison to the antipunch through implant, the Schottky barrier controlling layer requires a lower dose and thus results in a lower doping and thinner layer of implant. In some embodiments, the Schottky barrier controlling layer is approximately 0.01~0.05 μm thick. The Schottky barrier controlling layer can adjust the barrier height because the implant adjusts the surface energy between the contact electrode and the semiconductor. In FIG. 4V (ABC), the cross section of completed device 490 across the ABC plane is shown. Metal layer 478 is deposited, etched where appropriate, and annealed. Passivation openings are made after a passivation layer 480 is deposited. In some embodiments the passivation layer is omitted. Additional steps required to complete the fabrication such as wafer grinding and back metal deposition are also performed. In this example, the depth of gate contact trench 492 is shown to be the same as the active contact trench depth since gate contact trench 492 is not masked off and is subject to the second contact etch. In some embodiments, the gate contact trench is masked off and prevented from the second contact etch. As a result, the final gate contact trench is shallower than the active region contact trench in these embodiments.

FIG. 4S(DEF)-4T(DEF) are cross sectional views of the device on the DEF cross sectional plane. FIG. 4S(DEF) shows the cross sectional view of the device after the second contact etch. The active region trench depth in the DEF cross sectional plane does not change because the mask prevents further etching from taking place. FIG. 4T(DEF) shows the cross section of completed device 490 across the DEF plane. The mask is stripped. Metal layer 478 is deposited, etched where appropriate, and annealed. Passivation openings are made after a passivation layer 480 is deposited. Additional steps such as wafer grinding and back metal deposition are also performed.

Figure 5A:
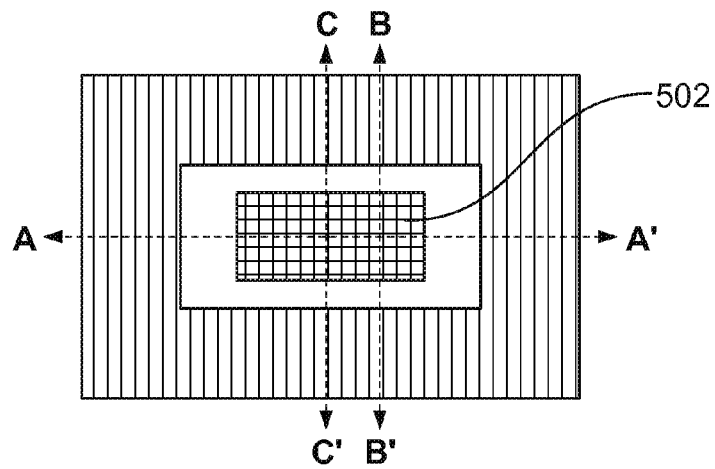
FIGS. 5A-5I illustrate an embodiment of a process for fabricating a closed cell device.
Figure 5B:
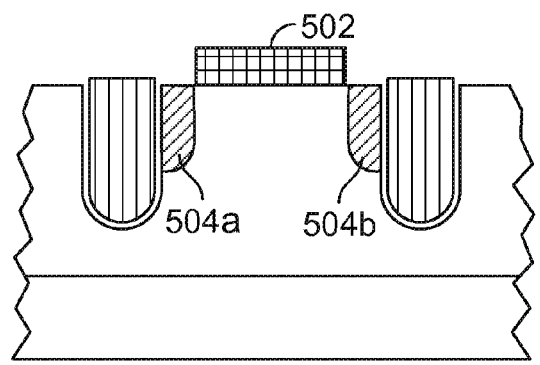
Figure 5C:
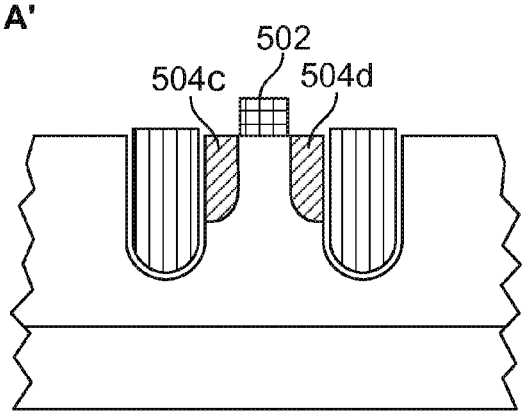

The above example illustrates a device that is a striped cell device. A striped cell device has gates that form a striped pattern, and the trench depth varies along one direction of the device (e.g., in the y-direction). The techniques shown can also be implemented on closed cell devices, in which the gates form a grid pattern instead of a stripe and the trench depth varies in at least two directions (e.g., in the x and the y directions). FIGS. 5A-5I illustrate an embodiment of a process for fabricating a closed cell device. FIG. 5A is a top view of a closed cell device that is being fabricated. A layer of photoresist is patterned to form a body block mask 502 used for blocking specific regions of the device from being implanted with body dopant. Three axes AA', BB', and CC' are shown. FIG. 5B shows the cross section of the device along the AA' axis after body implant. Body regions 504a and 504b are formed. FIG. 5C shows the cross sectional view of the device along the BB' axis. Body regions 504c and 504d are formed. Since the rectangular mask is narrower in the BB' direction, the channel between body regions 504c and 504d is narrower than the channel between body regions 504a and 504b. Such an elongated cell configuration allows greater cell density. At this point, the cross sectional view of the device along the CC' axis is the same as the cross sectional view along the BB' axis.

Figure 5D:
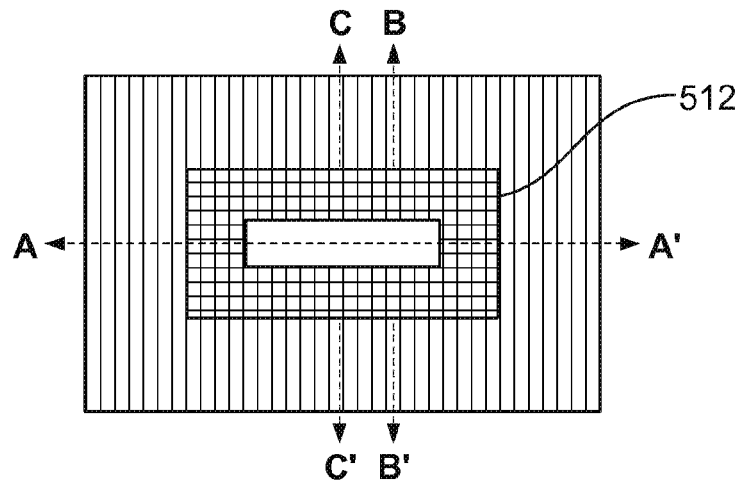
Figure 5E:
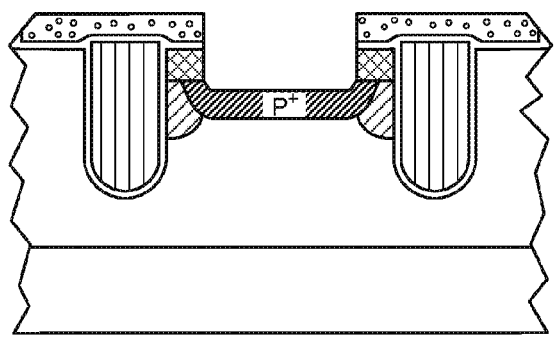
Figure 5F:
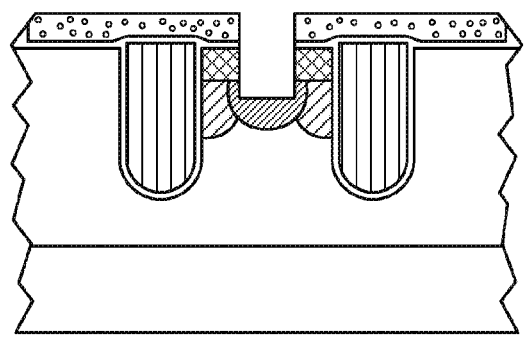

After body implantation, the source dopants are implanted, and a dielectric layer is disposed on the surface of the device using processing steps similar to those described in conjunction with FIG. 4N above. A first contact etch is performed next. FIG. 5D is a top view showing a photoresist layer patterned to form a contact mask 512 used for forming a first contact trench. A first contact etch is performed. The contact mask prevents the areas underneath the mask from being etched and allows other areas to be etched to form trenches. FIG. 5E shows the cross section of the etched device along the AA' axis. FIG. 5F shows the cross sectional view of the device along the BB' axis, as well as along the CC' axis which has the same cross sectional view at this point.

Figure 5G:
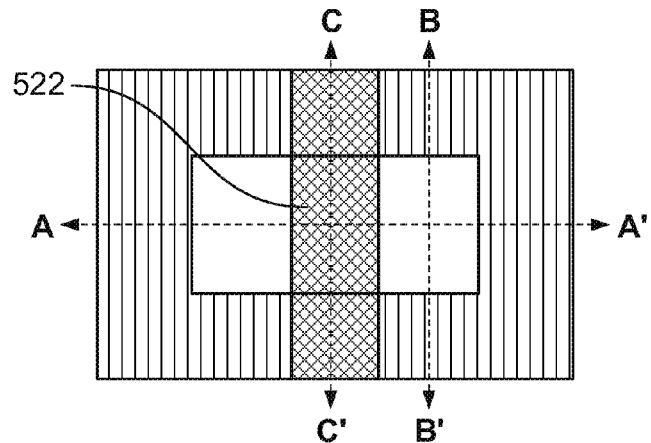
Figure 5H:
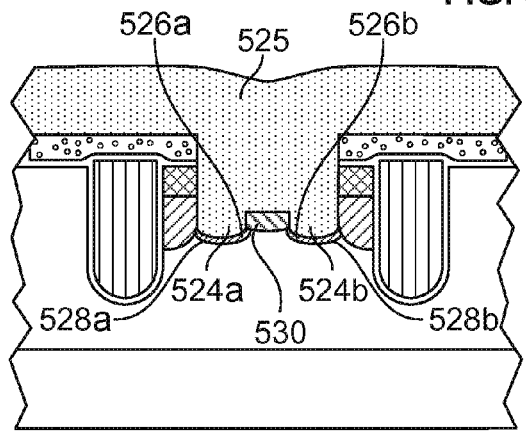
Figure 5I:
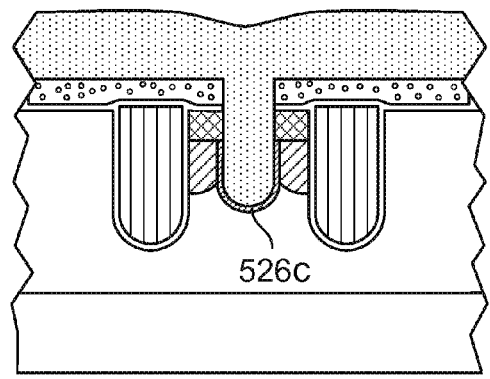

A second contact etch is then performed. FIG. 5G is a top view showing a contact block mask 522 used for blocking specific portions of the device from the second contact etch. FIG. 5H shows the cross section of the device along the AA' axis. P+ material is etched away in unmasked region 524a and 524b, forming trenches with greater depth. The trench depth in masked region 525 remains unchanged. Optional Schottky barrier controlling layers 526a and 526b are implanted in the bottoms of the deeper contact trenches. Schottky areas are formed in the bottom regions of the deeper trenches such as 528a and 528b. Body contact areas are formed is in the bottom regions of the shallower trenches such as 530. FIG. 5I shows the cross sectional view of the device along the BB' axis. The contact trench in this cross section is deepened also since the area was unmasked prior to the second contact etch. The cross sectional view of the device along the CC' axis remains unchanged from FIG. 5F since the region is masked off from the second etch. A closed cell device with a varying active region contact trench depth is thus formed.

Figure 6A:
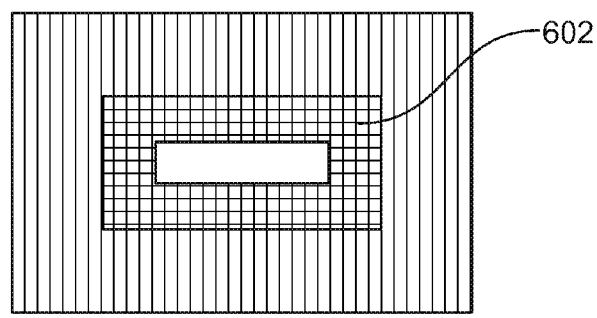
FIGS. 6A-6C illustrate another embodiment of a process for fabricating another type of closed cell device.
Figure 6B:
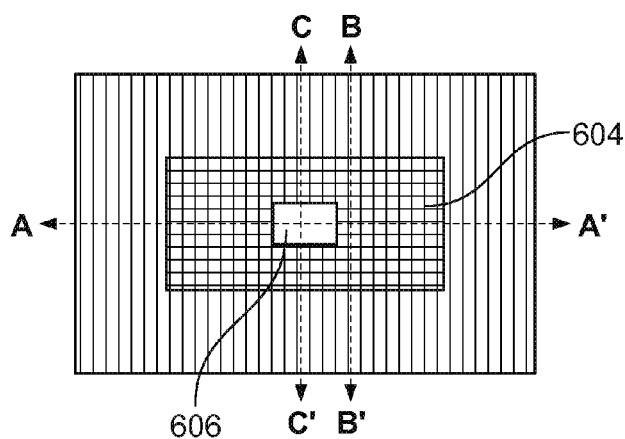
Figure 6C:
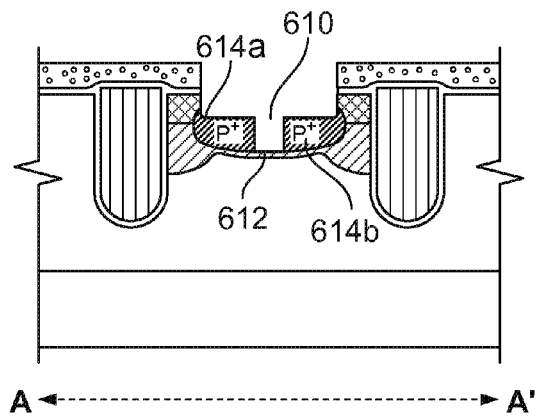

FIGS. 6A-6C illustrate another embodiment of a process for fabricating another type of closed cell device. FIG. 6A is a top view of the device being fabricated. A patterned photoresist layer forms a first contact etch mask 602. The unmasked center portion undergoes a first contact etch, forming the trench. FIG. 6B shows a top view of the device with a second contact block mask 604. A smaller unmasked region is formed in the center of the masked area. A second contact etch takes place, and the contact trench is deepened in center region 606. FIG. 6C shows the cross sectional view of the device along the AA' axis after the second contact etch. Contact trench 610 has a varying depth. A Schottky area is formed in the deeper center region 612 of the trench. In shallower regions 614a and 614b, the P+ material around the trench forms anti-punch through implants that better shield the channel region against punch through.

Since the contact masks are rectangular, the cross sectional view of the resulting device along the CC' axis is similar to FIG. 6C except the trench width is narrower. In this example, the cross section along the BB' axis is similar to what was shown in FIG. 5F, where the P+ material envelops the bottom of the trench and forms a body contact. The trench width can vary in other embodiments where contact masks with different widths are used.

Figure 7:
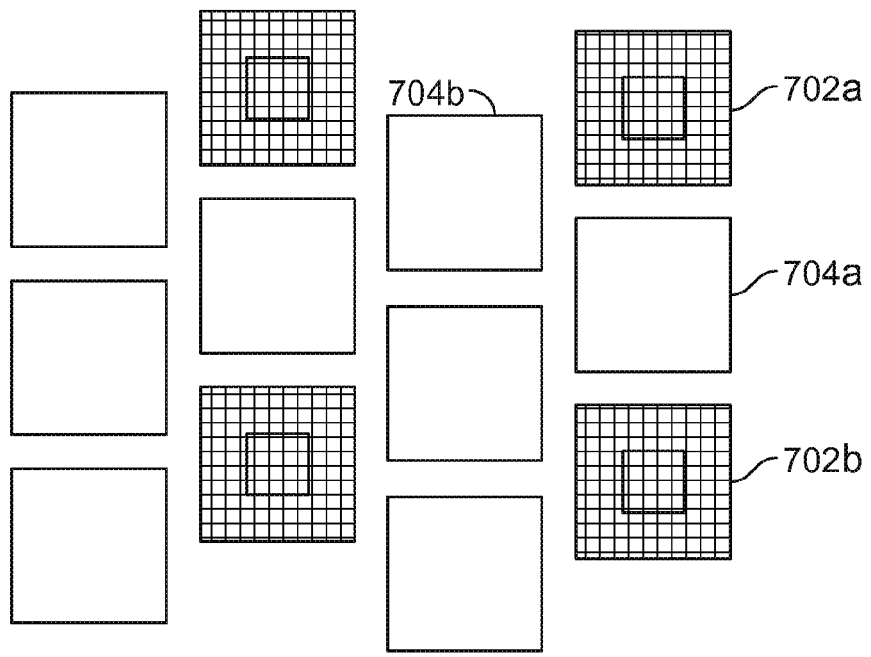
FIG. 7 is a top view diagram showing an embodiment of a multi-cell device.

In some embodiments, multi-cell semiconductor devices employ a layout of cells with Schottky contacts intermixed with cells without Schottky contacts. FIG. 7 is a top view diagram showing an embodiment of a multi-cell device. Cells such as 702a and 702b are cells with varying contact trench depth in which Schottky contacts form in the deep contact trench regions. Cells such as 704a and 704b are shallow trench cells that form body contacts only. The ratio of Schottky area to body contact area can be adjusted by adjusting the ratio of the number of Schottky cells to the number of shallow trench cells.

Figure 8:
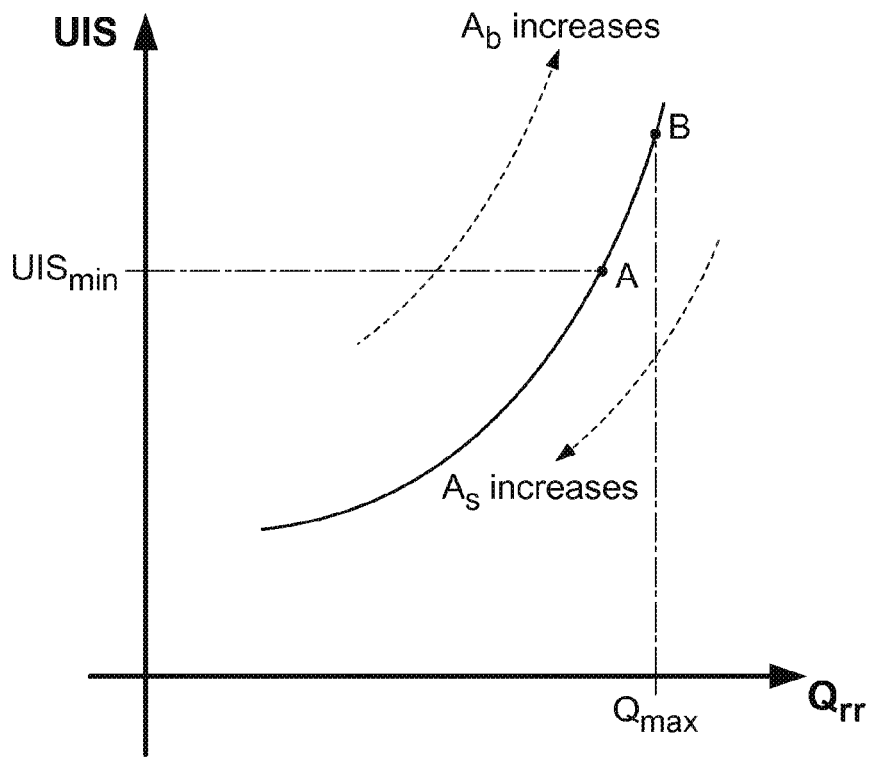
FIG. 8 is a plot showing the relationship between the UIS and Qrr characteristics of an example device with a certain amount of total area.

A lower Schottky area ($A_s$) to body contact area ($A_b$) ratio reduces leakage current and increases the device's UIS rating but increases diode reverse recovery charge (Qrr). Desired device characteristics can be achieved by adjusting this ratio and making appropriate tradeoffs. FIG. 8 is a plot showing the relationship between the UIS and Qrr characteristics of an example device with a certain amount of total area. As $A_s$ increases, $A_b$, UIS, and Qrr all decrease. The plot is used to inform design choices by allowing the designer to compare results and make appropriate tradeoffs. For example, given design parameters including a minimum acceptable $UIS_{min}$ and a maximum acceptable $Qrr_{max}$, corresponding points on the curve are located and labeled as A and B. Any $A_s:A_b$ ratio that falls between A and B will satisfy the requirements, while a device with an $A_s:A_b$ ratio that corresponds to point B provides the best UIS capability while keeping Qrr at an acceptable level.

The above examples illustrate N-type devices. The techniques described are also applicable to P-type devices, in which polarities of various dopants are reversed.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of fabricating a semiconductor device, comprising:
   forming a gate trench in an epitaxial layer overlaying a semiconductor substrate;
   disposing gate material in the gate trench;
   forming a body in the epitaxial layer;
   forming a source in the body;
   forming an active region contact trench that has a varying trench depth, including:
     performing a first etch to form a first contact trench depth associated with a first region; and
     performing a second etch to form a second contact trench depth associated with a second region; wherein the first contact trench depth is substantially different from the second contact trench depth; and
   disposing a contact electrode within the active region contact trench.

2. The method of claim 1, wherein:
   performing the first etch includes:
     applying a first mask; and
     etching to achieve the first contact trench depth; and
   performing the second etch includes:
     applying a second mask; and
     etching to achieve the second contact trench depth.

3. The method of claim 1, wherein a Schottky contact is formed in the first region.

4. The method of claim 1, further comprising forming a drain on the back of the semiconductor substrate; wherein a Schottky contact is formed in the first region by the contact electrode and a drain region.

5. The method of claim 1, further comprising forming a drain on the back of the semiconductor substrate; wherein a Schottky contact is formed in the first region by the contact electrode and a drain region, and the method further comprises forming a Schottky barrier controlling layer in the epitaxial layer below the Schottky contact.

6. The method of claim 1, wherein a Schottky contact is formed in the first region, and the method further comprises forming an anti-punch through implant on a side wall of the first region of the active region contact trench.

7. The method of claim 6, wherein forming the anti-punch through implant includes forming a heavily doped region.

8. The method of claim 7, wherein a body contact is formed in the second region by the contact electrode and the heavily doped region.

9. The method of claim 1, wherein the gate trench is formed in a striped pattern.

10. The method of claim 1, wherein the gate trench is formed in a grid pattern.

11. The method of claim 1, wherein:
    the gate trench is formed in a grid pattern such that the semiconductor device is a closed cell device having a width and a length; and
    forming the active region contact trench includes forming the first contact trench depth and the second contact trench depth along a length-wise cross section.

12. The method of claim 1, wherein an area ratio of the first region and the second region is controlled to meet both an unclamped inductive switching (UIS) recovery requirement and a diode recovery requirement.

* * * * *